United States Patent [19]

Knight

[11] Patent Number: 4,905,261

[45] Date of Patent: Feb. 27, 1990

[54] DEFROSTING GRID SYSTEM TESTING APPARATUS

[75] Inventor: Keith L. Knight, Lancaster, Ohio

[73] Assignee: Zane Machine Co., Lancaster, Ohio

[21] Appl. No.: 300,572

[22] Filed: Jan. 23, 1989

[51] Int. Cl.⁴ .................. G01R 31/02; G06M 1/27
[52] U.S. Cl. ............................................ 377/19; 377/3; 377/12; 324/505
[58] Field of Search .......................... 377/3, 12, 19

[56] References Cited

U.S. PATENT DOCUMENTS

| | | | |
|---|---|---|---|
| 3,825,818 | 7/1974 | Mayberry | 377/3 |
| 3,911,357 | 10/1975 | Adam | 324/505 |
| 4,185,298 | 1/1980 | Billet et al. | 377/3 |
| 4,395,677 | 7/1983 | Petersdorf | 324/505 |
| 4,409,541 | 10/1983 | Richards | 324/505 |

Primary Examiner—John S. Heyman
Attorney, Agent, or Firm—Francis T. Kremblas, Jr.

[57] ABSTRACT

A window defrosting grid testing apparatus which is automated to test the resistance grid for quality control relative to set automotive standards including the continuity of each line of the grid. In one preferred embodiment, the testing device includes means for automatically clamping the window in position on a support table and engaging a set of three conducting probes in conducting contact with the grid at predetermined locations associated with opposing ends of the grid lines and an intermediate position between the opposing ends. The probe in the intermediate position is mounted for lateral and transverse travel across the grid lines and is operatively connected to a voltage sensitive relay which operates to provide a signal only when the energized grid line engaged by the intermediate probe is non-defective relative to continuity. Additionally, the testing apparatus also includes a testing circuit checking the overall resistance of the grid and means to induce a higher voltage across the grid prior to continuity testing to more easily detect weakened points along the length of a grid line and provide more efficient quality control.

10 Claims, 8 Drawing Sheets

DEFROSTING GRID SYSTEM TESTING APPARATUS

BACKGROUND ART

The present invention relates to testing devices for window grids used for resistance defrosting of windows such as is common in the auto industry. Resistance grids of this type are well-known and consist of relatively thin lines of a conducting material "painted" onto one surface of the window in a predetermined parallel grid pattern between a pair of bus lines connecting the opposing ends of each grid line.

Quality control techniques for testing the continuity of these grids are an important step in their manufacture. Prior devices developed to check for breaks in these lines have been less than satisfactory because of a lack of accuracy or a lack of proper manual manipulation of the device across the grid top assure accurate detection of any substandard grids.

With the introduction of rear window taillights, a different grid pattern is presented which adds to the difficulty of properly detecting poor quality grid lines or breaks in their continuity. Prior to the present invention, quality control testing devices have not provided the accuracy or the consistency of testing in a manner deemed fully satisfactory for the intended purpose.

BRIEF DISCLOSURE OF INVENTION

The present invention relates to inspection and testing apparatus for a resistance defrosting grid system such as used in automobile rear windows.

In accordance with the present invention, the apparatus includes a test stand or bench support means upon which the window is positioned. Upon appropriate signal from a control means, electrical conducting probes automatically move into contact with the grid at predetermined positions to check in sequence the overall resistance level and then the continuity of the conducting integrity of each of the grid lines.

Also provided is a high voltage test wherein 24 volts is applied across the grid prior to the continuity check to accentuate any defect in the grid lines to assure that such defects will be detected during the continuity check.

The continuity test is conducted using a moving contactor which is programmed to move transversely to the grid lines. The polarity of the applied voltage is switched between a pair of conducting probes positioned on the major conducting bus line at the left and right end of the grid relative to the moving conductor to permit checking the voltage between both the right and left end probe and the moving conductor. This feature assures that an accurate check of the grid lines along their entire length is performed.

The apparatus also includes a feature for accurately checking the interrupted grid system employed in windows having a backlight positioned on the lower portion of the window. In this mode, the center moving contact probe is programmed to cross the grid lines four times along an "X" coordinate with a lateral shift along a "Y" coordinate to cover all possible breaks in the grid system.

An electrical circuit is provided with appropriate control means to switch the polarity between the left and right end probes and the center moving probe between transverse passes of the center probe across the grid. Means are operatively connected to the center probe to initiate a signal when a non-defective grid line is contacted. The signals generated are counted and compared to a standard number and a reading is generated reflecting the number of defects, if any.

In the preferred embodiment, a conventional personal computer is used to control the various electrical functions and to provide a printout of the desired information. The computer is conventionally programmed according to the results desired.

Further, in the preferred embodiment, a reject feature is provided wherein defective windows may be automatically transferred to a separate collecting area apart from those which have passed the inspection test.

Therefore it is a primary object of the present invention to provide a window defrosting grid system testing apparatus which effectively tests overall resistance levels and continuity of the grid in a more accurate and reliable manner than prior apparatus.

It is another object of the present invention to provide an apparatus of the type described which easily accommodates testing of window grid systems which have rear backlights positioned on the window.

It is another object of the present invention to provide an apparatus of the type described which tends to eliminate manual errors associated with the use of prior apparatus and which may be programmed to automatically provide a printed record of each test result.

It is another feature of the present invention to provide electrically actuated mechanical means to position the test probes in a predetermined test position in engagement with the grid and control means to automatically sequence the testing steps necessary to complete the test.

It is another feature of the present invention to provide an automated system for removing rejected windows having a defective grid system for convenient collection apart from those which passed inspection.

It is yet a further aspect of the present invention to provide a cost effective, accurate, testing apparatus for defrosting grid systems which requires little maintenance and is reliable for volume production such as encountered in the automatic industry.

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose. For example, the word connected or terms similar thereto are often used. They are not limited to direct connection but include connection through other circuit elements where such connection is recognized as being equivalent by those skilled in the art.

DETAILED DESCRIPTION

Figure 1:
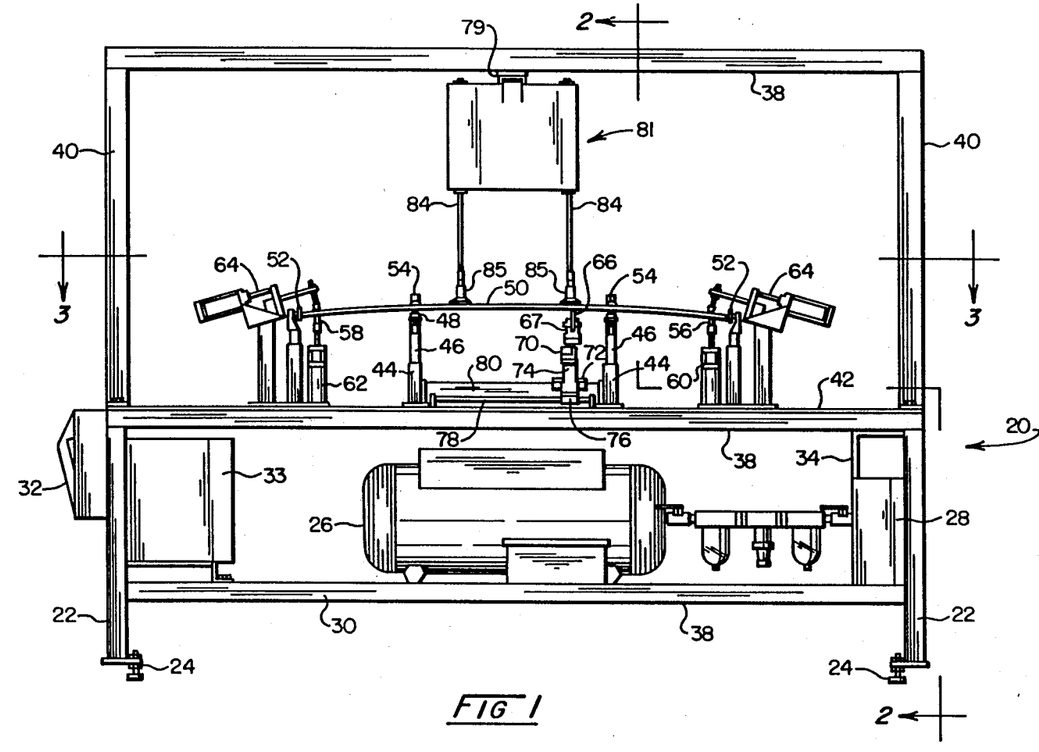
FIG. 1 is a front elevational view of an inspection and testing apparatus for window defrost grid systems constructed in accordance with the present invention.
Figure 2:
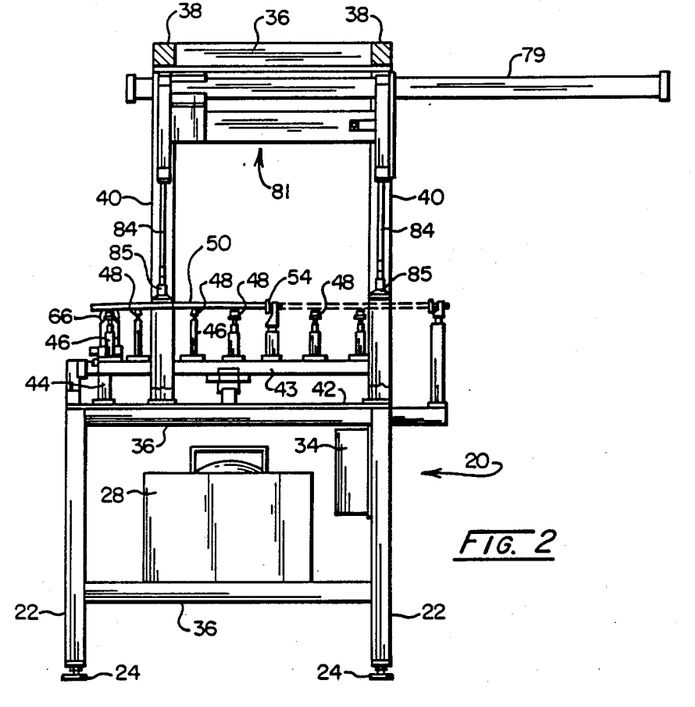
FIG. 2 is a side elevational view of the apparatus shown in FIG. 1.
Figure 3:
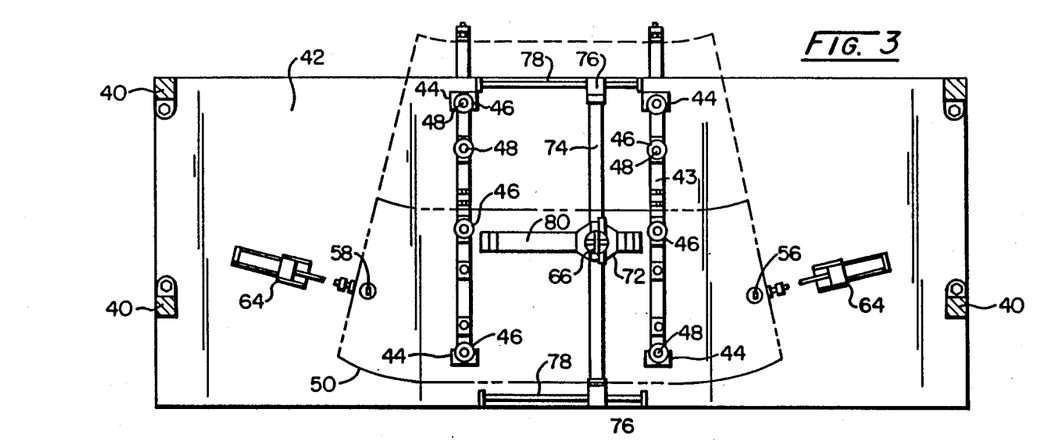
FIG. 3 is a partial top plan view of the apparatus shown in FIG. 1 illustrating the main portion of the window supports and the electrical conducting probes forming a portion of the present invention.

The mechanical portion of an auto window defrosting grid system testing apparatus constructed in accordance with the present invention is shown in FIGS. 1-3 and includes a supporting frame or test stand indicated generally at 20.

Frame 20 includes front and rear legs 22 provided with leveling pads 24 to adjust the level of the frame on the supporting floor. The various pneumatic cylinders and pistons described later herein are operatively connected to a air compressor and control system in a conventional manner which includes a surge tank 26 and a pneumatic control box 28 containing the associated valving equipment, well-known to those skilled in the art, which are mounted on a lateral frame member 30 in a conventional manner.

A main manual power switch 32 is mounted to frame 20 and is operatively connected to a conventional transformer, indicated at 33, which is also mounted on lateral frame members 30. A junction box 34 is mounted on the top of control box 28 and serves to provide the various electrical equipment necessary to operate the pneumatic controls as directed by the electrical circuitry of the apparatus controlled by a conventional computer, not shown. The computer is programmed to automatically actuate the various air cylinders in a predetermined sequence as well as provide the various command functions to sequence the switching function in the electrical circuitry necessary to properly conduct the test.

The frame 20 also includes lateral support members 36 and 38 and vertical member 40 to provide a rigid base frame for a support table 42 fixed in any conventional manner to frame 20. Various mechanical components are mounted on table 42 as described below herein.

Laterally spaced vertical supports 44 are conventionally fixed to table 42 upon which a pair of horizontally extending beams 43 are attached in a raised position above table 42. A plurality of vertically extending, rearwardly spaced window support rests 46 are fixed on each horizontal beam 43. The upper ends of each rest 46 includes a non-conducting tip 48 made of nylon or other suitable material. An auto window 50, provided with a conventional defrosting grid system to be tested, is placed upon and supported by rests 46 and accurately positioned between a laterally disposed locator stop 52 and rearwardly disposed locator stops 54. Each stop 52 and 54 is provided with threaded adjustment screws to permit adjustment of the desired position of the window being tested to assure proper alignment with electrically conducting probes 56 and 58. Probes 56 and 58 are disposed to engage the left and right bus lines provided in the window grid pattern.

Probes 56 and 58 are mounted for vertical movement responsive to pneumatic cylinder and piston assemblies 60 and 62, respectively, for vertical movement into and out of engagement with window 50 upon appropriate command of the program control means.

A pair of pneumatic cylinder and piston actuated clamp assemblies 64 are mounted on table 42 to engage each end of the upper surface of window 50 and hold the window in position during the test. Each clamp is retracted upon command after the test has been completed. Preferably, clamp assemblies 64 are located in direct opposing relationship to probes 56 and 58 to assure positive electrical contact between the window grid and the conducting ends of the probes.

A centrally disposed electrically conducting probe is provided in the form of a conducting wheel 66 rotatably mounted to bracket assembly 67. Preferably, probe 66 and bracket assembly 67 are mounted on a conventional pneumatic rotary actuator 70 for horizontal pivoting movement. In turn, actuator 70 is operatively mounted to a band cylinder 74 for movement of probe 66 from front to rear across window 50. Rotary actuator 70 may be a conventional air operated actuator designed to pivot bracket assembly 67 and probe 66 ninety degrees between perpendicular and parallel positions relative to the grid lines 51 of window 50. Probe 66 is also spring biased for vertically resilient engagement with window 50 to assure positive contact but limit the force exerted on the window.

Each end of band cylinder 74 is mounted to a linear bearing 76 which in turn is slideably mounted on a pair of parallel spaced, laterally extending guide rods 78. Another band cylinder 80 is mounted on table 42 and to band cylinder 74 via a bracket 72 to move band cylinder 74 carrying bracket 67, rotary actuator 70 and probe 66 longitudinally along the axis of rods 78.

Therefore upon appropriate actuation of band cylinders 74 and 80, rotary actuator 70, probe mounting bracket 67 and probe 66 may travel one or more predetermined paths transverse to grid lines 51 of window 50 at predetermined laterally spaced positions between the opposing ends of rods 78.

In the preferred embodiment shown, a transfer system is provided which permits automatically picking up a window 50 which fails to pass the inspection test for transfer to a separate location apart from windows which pass the test. If desired, automated removal of a passing or defective window can be easily provided or either can be manually removed without departing from the spirit of the present invention.

The transfer system includes a transfer piston and cylinder assembly 79 conventionally mounted to a pair of lateral support beams 38 forming part of frame 20.

A transfer support assembly, indicated generally at 81 is mounted for reciprocal linear movement along the length of the piston stroke of assembly 79 and includes four downwardly extending pick-up cylinder and piston assemblies 84. Each cylinder and piston assembly 84 is provided with a vacuum suction cup 85 at the lower end thereof which is adapted to releasably engage a window 50 positioned on window rest supports 48.

Upon appropriate command, the components of the transfer system may be actuated in cooperation with the testing sequence of the grid system to automatically pick-up a defective window 50 and transfer it rearwardly to a conveyer or the like, not shown, for separate collection of any window deemed defective by the testing procedure. Alternatively, non-defective windows could be transferred in this manner if desired.

Figure 5:
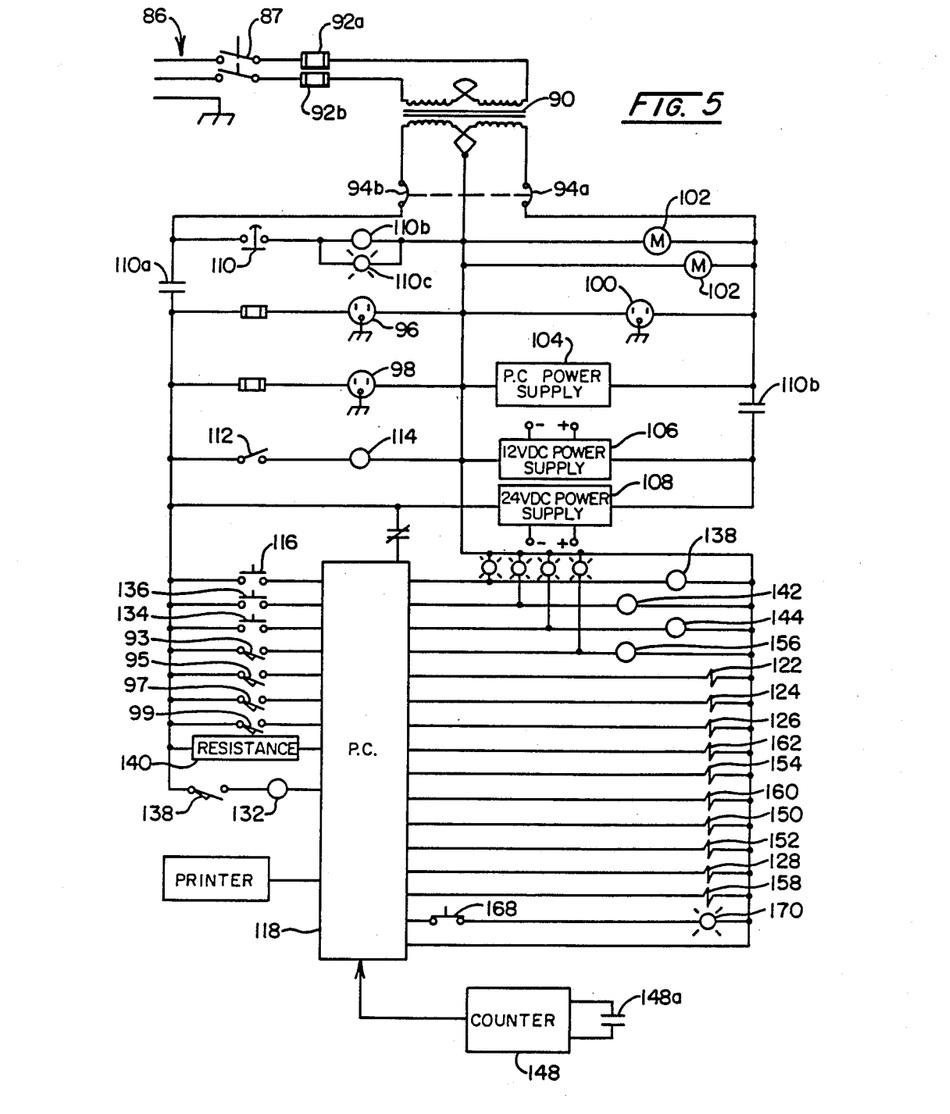
FIG. 5 is a schematic representation illustrating an electrical circuit used in the present invention.

With reference now to FIG. 5, a typical electrical circuit for operation of the present invention is diagrammatically shown in connection with a computer control program using conventional computer apparatus.

A conventional source of three phrase electrical power diagrammatically illustrated at 86 is connected to isolation transformer 88 through a main disconnect switch 87 and appropriate fuses 92a and 92b. Transformer 90 is operatively connected to each side of the power supply portion of the circuit through appropriate circuit breakers 94a and 94b. The power supply circuit conventionally includes an outlet connection 96 to a printer associated with a computer. A similar outlet 98 is provided to a resistance test gauge 140 and an outlet 100 to a conveyer, not shown, associated with the reject transfer system. Fan motors 102 are included for conventional cooling purposes. A computer power supply 104, a twelve volt power supply 106, and a twenty-four volt power supply 108 are provided to properly conduct the testing procedure described herein.

To operate the apparatus, a manually operated power on switch closes contacts 110 and 110a and actuates indicator light 110c via relay 110b.

A manual test switch 112 is provided to actuate relay 114 to permit the operator to run a check on the computer controlled test procedure sequence and print-out to determine if the system is properly operating.

To start an inspection test, the operator places the window under test upon the non-conducting support rests 46 and probe 66 and against the locator stops 52 and 54. Then a switch 116 is manually actuated to the input side of the conventional computer 118 which is programmed to actuate the probe cylinders 60 and 62 to raise the probes 56 and 58 into contact with the surface of window 50 upon which the defrosting grid is applied and clamp assemblies 64 are actuated to descend to engage the window 50. At the same time, cylinders 84 are actuated to descend and engage suction cups 85 with the window 50. Then a relay 128 is actuated to apply vacuum to cups 84 and a switch 130 is closed by relay 132 to connect the plus side of twelve volt power supply 106 to probe 66.

A manual emergency stop switch 134 is provided if there is any problem at this point in the test procedure relating to the window placement or the like. If no problem is present, the operator activates program start switch 136 to begin the test program sequence via the program of computer 118.

Figure 7A:
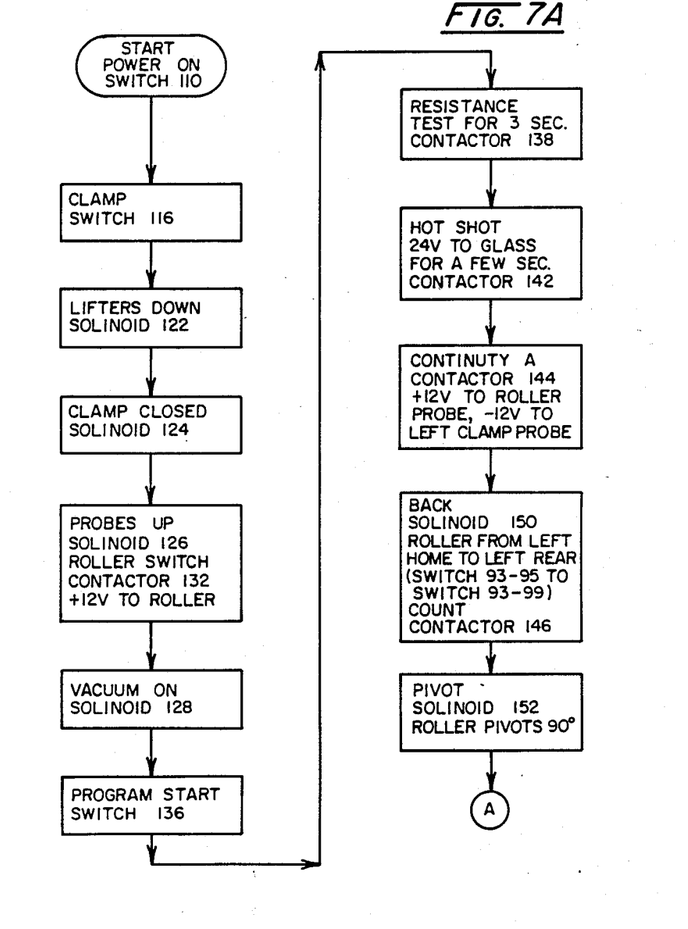
FIGS. 7A, 7B and 7C are schematic representations illustrating the control sequence of a conventional computer program which may be used in association with the present invention to automatically control the testing program.
Figure 7B:
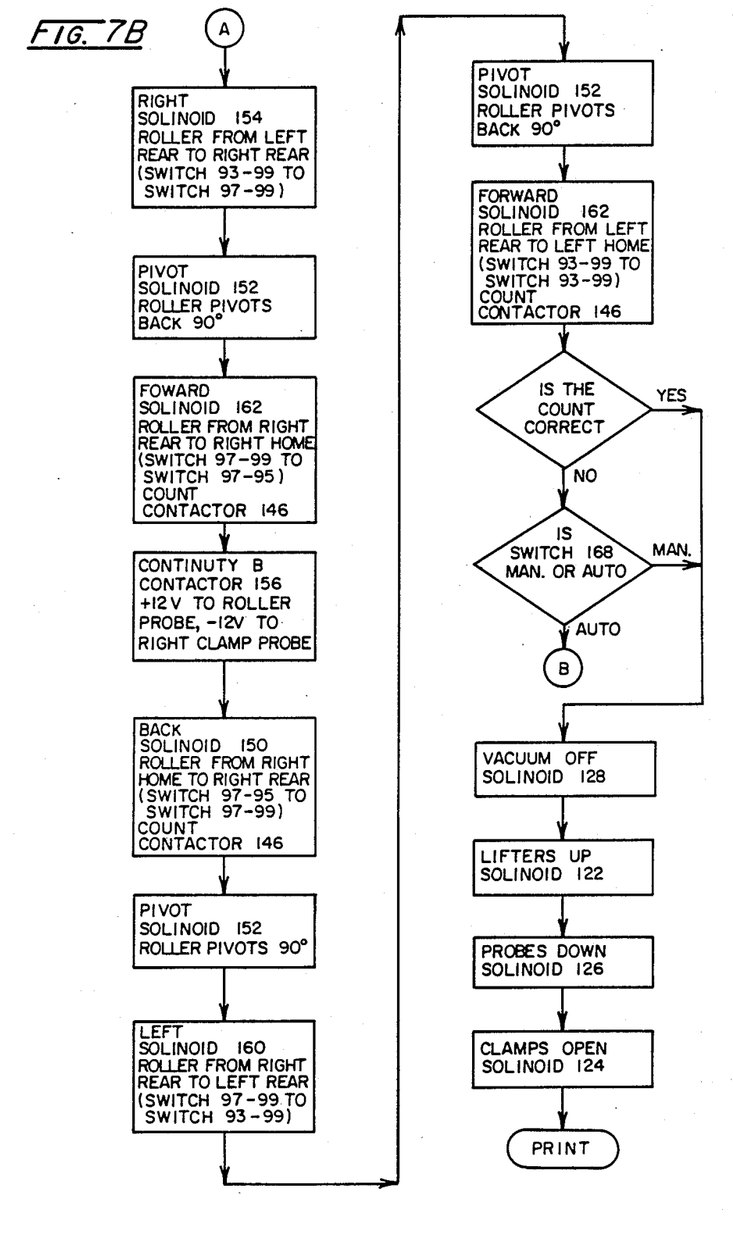
Figure 7C:
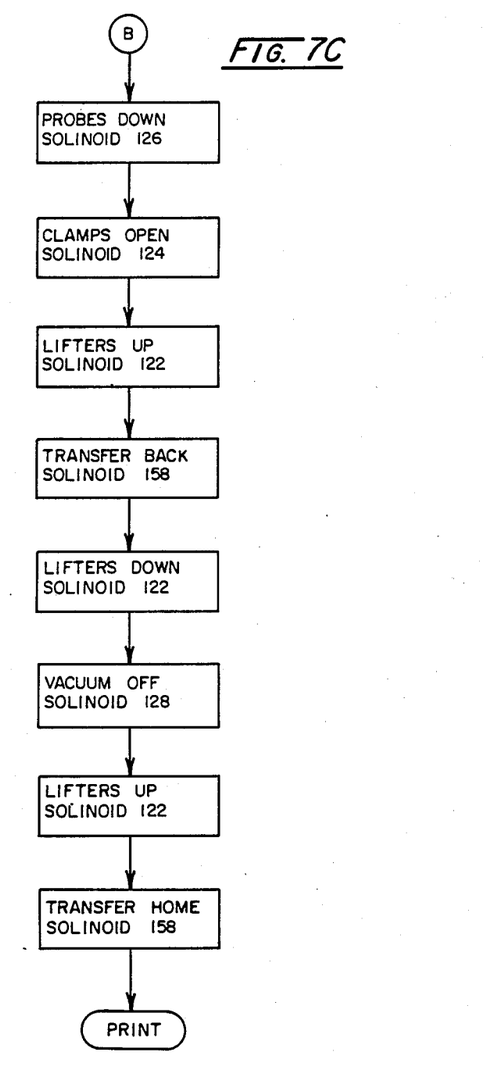

The above steps and the below described sequence are schematically shown in FIGS. 7A, 7B and 7C.

Upon actuation of switch 136, computer 118 automatically commands a sequence of steps beginning with actuation of relay 138 to start a resistance test of grid 51 for a predetermined time period. Approximately, a three second time period has proven to work well to ascertain whether or not the overall resistance of the grid is within the standard acceptable range specified by the auto manufacturer. A standard resistance meter 140 is employed to measure the resistance reading and may be adjusted to the high or low limits of the designed range. An indicator light 138a is connected to relay 138 to conveniently provide a visual signal to the operator indicating the test phase being conducted.

Figure 6:
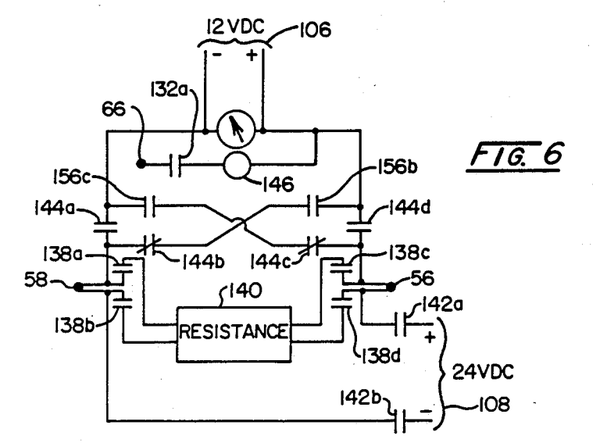
FIG. 6 is a schematic representation of a portion of the circuit shown in FIG. 5.

FIG. 6 is a diagrammatic circuit employed in connection with the present invention and provides added details supplementing the circuit shown in FIG. 5. Actuation of relay 138 closes contacts represented by 138a, 138b, 138c and 138d to connect the twelve volt source 106 across the probe contactors 56 and 58 and to the resistance meter 140 as best seen in FIG. 6. The resistance reading of meter 140 is conventionally stored in computer 118. Computer 118 then actuates relay 142 to connect the grid with twenty-four volt power supply 108 via the probe contactors 56 and 59 to apply a higher amperage across the grid than that applied by the normal twelve volt source.

This procedure lasts approximately one or two seconds and is preferred to accentuate any break or "thin spot" in grid lines 51 to assure detection in the continuity test which follows.

As shown in FIG. 6, relays 142 closes contacts 142a and 142b to connect probes 56 and 58 to power source 108. After the high voltage test above, the continuity check is programmed to begin and relay 144 is actuated to start the first of four continuity test phases. In the preferred embodiment described herein, window 50 has a grid design used for autos provided with a rear window backlight deposed in the cut-out portion 52 shown in FIG. 4. This grid pattern represents a problem for testing in that the three lines 51 of the grid adjacent to cut-out area 53 are interconnected with one another along the perimeter of the outline of cut-out area 53.

Figure 4:
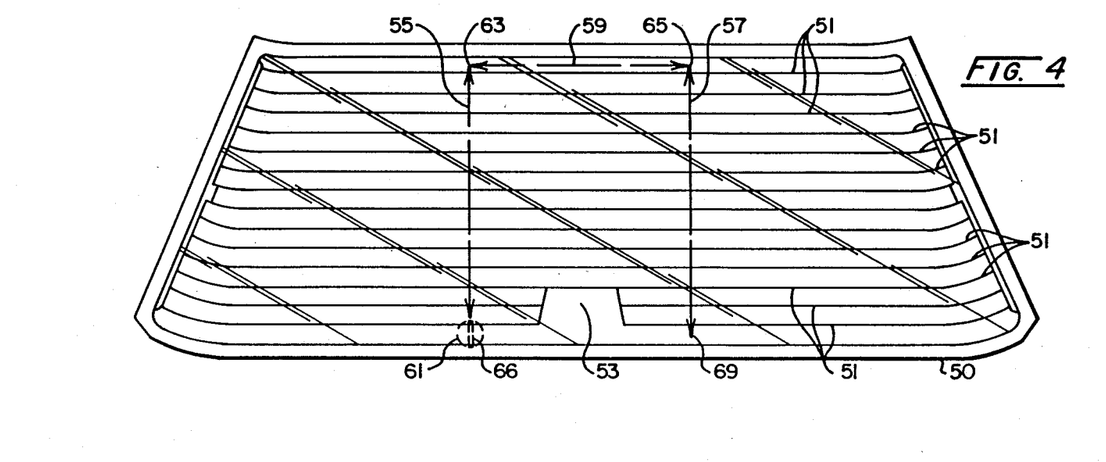
FIG. 4 is a top plan view illustrating a typical auto rear window provided with a defrosting grid system used with windows having a backlight.

However, the present invention provides an apparatus and method which overcomes the prior difficulties in accurately testing grid line continuity as described herein and particularly is adapted to satisfactorily test the grid pattern as shown in FIG. 4.

Probe 66 is capable of both transverse and lateral movement relative to grid lines 51. The first phase of testing for continuity of each grid line 51 occurs upon actuation of relay 144 which closes contacts 144a, 144b, 144c and 144d as seen in FIG. 6. This connects the positive side of twelve volt source 106 to probe 66 via a voltage sensitive relay 146 and contacts 132a. The negative side of voltage source 106 is connected to left probe 58.

Relay 146 is a conventional commercially available relay sensitive to a given voltage range, such as above three and below twenty-five volts for example. However, depending upon the design of the circuit and the testing application, other ranges could be employed to provide an accurate continuity test in accordance with the present invention.

Therefore upon actuation of solenoid 144 by computer 118, centrally disposed rotatable probe 66 and right probe 56 are connected to the plus side of voltage source 106 and left probe 58 is connected to the negative side of source 106. The voltage reading between probe 66 and 58 for each non-defective grid line 51 contacted should be a standard calculated value depending upon the position of probe 66. The operative range of relay 146 is chosen to include the desired standard values so that relay 146 actuates a pair of contacts 146a to close to provide an impulse to a conventional counter 148 as probe 66 passed over a non-defective grid line 51. Probe 66 is caused to move in a forward to rear direction transverse to grid lines 51 as directed by a computer actuated solenoid 90 directing band cylinder 74 to move probe 66 across each grid line 51. An impulse is counted by counter 148 when the voltage between rolling probe 66 and one of the probes 56 or 58 connected to the opposite polarity of the source 106 falls within the operative range of relay 146. Therefore an impulse is generated each time probe 66 contacts a non-defective grid line 51 as measured between the operative probes connected to opposing polarity of the source.

Conversely, if a break in a grid lines is present between the probe 66 and the operative one of probes 58 or 56, a voltage value outside the operative range of relay 146 is produced such that contacts 146a remain open and no impulse is seen by counter 148.

The paths chosen for probe 66 to cross grid lines at a right angle to accurately detect a broken or discontinuous grid line depends upon the design of the grid system of window 50. For example, a standard grid defrost system in a rear window having no provision for a backlight could be satisfactorily tested by a single pass up and another down across the grid at the same lateral point relative to each end. However, in those windows having a cut-out section such as shown in FIG. 4, probe 66 must travel along at a position on each side of the cut-out section 53 such as indicated by the broken lines 55 and 57 in FIG. 4.

Further, assuming probe 66 is always connected to the positive side of voltage source 106, the circuitry must provide for switching the negative side of the voltage source 106 between the left and right probes 58 and 56 coordinated with the transverse passes of probe 66 in order to properly cover any defects along the entire length of the grid lines 51.

In the preferred embodiment described herein, probe 66 travels the path shown by arrows 55, 57 and 59 as dictated by the programmed computer 118 which actuates the cylinder and piston assemblies 74 and 80 for either transverse or lateral movement of probe 66. Also rotary actuator 70 is actuated to pivot probe 66 ninety degrees to align the axis of rolling probe 66 perpendicular to the chosen direction of travel. The steps of the computer program are diagrammatically represented in FIGS. 7A, 7B and 7C.

The program is designed to start probe 66 at the extreme left and front position, termed "left home". A diagrammatic illustrations, such as shown in FIG. 6a, illustrates the positions of probe 66 as dictated by actuation of the cylinder and piston assemblies described herein and are referred to herein as left and right "home" and left and right "rear" positions 61, 63, 65 and 69 respectively as seen in FIG. 4.

In the first continuity test phase or pass of probe 66, after solenoid 144 has properly actuated the described connections between source 106 and probes 66, 58 and 56, solenoid 150 is actuated to cause band cylinder 74 to move probe 66 rearwardly along the line 55 from left home to the left rear position.

Figure 6A:
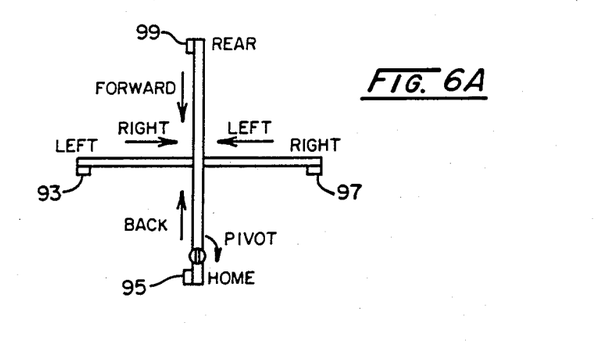
FIG. 6A is a schematic representation of the various positions of the movements of one of the electrically conducting probes forming a portion of the apparatus of the present invention.

Contact switches 93, 95, 97 and 99 diagrammatically shown in FIG. 6A, are conventionally provided in connection with the band cylinders 74 and 80 and the piston and cylinder assembly 68 to sense the position of probe 66 and set up the next command in the operation of the program.

As probe 66 crosses each grid line 51, the voltage value between probe 66 and left probe 58 should be within a set value for a continuous, non-defective grid line. Generally this value is proportional to the distance between the probes 66 and 58, relatively to the length of grid lines 51 and the maximum twelve volts applied to the grid. Therefore an appropriate voltage value for a given segment of a grid line 51 can be easily calculated. The path of probe 66 represented by line 55 determines that the calculated voltage value between probes 66 and 58 should be approximately 3.5 volts, for example, to meet the desired automotive specifications.

Since relay 146 operates to close contacts 146a to counter 148 each time a voltage value above three volts is sensed as probe 66 contacts a grid line 51, an impulse is sent to counter 148. If a continuity defect is present in a grid line 51 between probes 66 and 58, such that the voltage falls outside the operative range of relay 146, contacts 146a remain open and no impulse will be seen by counter 148. Therefore, a specific number of counts will occur upon the first pass of probe 66 coinciding with each non-defective portion of grid lines 51 as measured between probe 66 and the operative probe 56 or 58 having an opposing polarity to probe 66.

Upon reaching left rear position 63, the contact switches are actuated to signal computer 118 to actuate a solenoid 152 which actuates rotary actuator 70 to pivot probe 66 ninety degrees and another solenoid 154 to actuate band cylinder 80 to cause band cylinder 74 carrying probe 66 to move across line 59 to the right rear position 65.

Upon reaching the right rear position, contact switches associated with the position of probe 66, as shown in FIG. 6A, provide a signal to actuate solenoid 152 to pivot probe 66 ninety degrees to its original disposition. In sequence with solenoid 152, a solenoid 162 is next actuated to cause band cylinder 74 to move from the right rear position 65 to the right home position 69 across grid lines 51 along line 57.

With the electrical circuit in this mode, as probe 66 makes contact with each grid line, relay 146 sees the voltage between probes 66 and 56. In the same manner as described earlier herein, a defect in continuity in any grid line results in a voltage value which falls outside the operative range of relay 146 such that only non-defective grid lines contacted by probe 66 will result in an impulse counted by counter 148.

With the two passes described above, each grid line 51 has been checked for defective breaks along their length only between the point of engagement with probe 66 along the lines of travel 55 and 57 and the left end of each grid line.

As probe 66 reaches the right home position 69, the above mentioned contact switches associated with the right home position 69 are actuated to initiate computer 118 to actuate relay 256 to cause the polarity of power source 106 to switch the negative pole from probe 58 to probe 56 via closing contacts 156c and 156b as shown in FIG. 6. In addition, solenoid 150 is actuated to cause band cylinder 74 to move probe 66 from the right home position 69 to the right rear position 65.

In this disposition, relay 146 "senses" the voltage value generated between the right end of each grid line 51 and probe 66 as it contacts the grid lines along the line of travel 57.

As probe 66 reaches the right rear position 65, the appropriate pair of contact switches are actuated to provide a signal to computer 118 to again actuate probe 66 to pivot 90 degrees add band cylinder 80 to cause probe 66 and band cylinder 74 to shift laterally to the left rear position 63 via solenoids 152 and 160. Upon reaching the left rear position 63, contact switches again provide a signal to computer 118 to actuate solenoid 153 to rotate probe 66 ninety degrees and then band cylinder 74 to shift probe 66 to the right home position 61 via a solenoid 162.

Since relay 156 has closed switches 156b and 156c, right probe 56 is still connected to the negative pole of power source 106. Therefore the grid lines 51 are checked from the points of contact of probe 66 as it travels forward along line 55 and the right end of each grid line in electrically conducting relationship to probe 66. In the same manner as the second pass of probe 66 forwardly along line 57, this fourth pass along line 55 particularly covers any defects in continuity of the three lines commonly connected to the outline of cut-out portion 53 between the path of travel of probe 66 and cut-out portion 53.

The computer 118 is programmed to check the total of counts which should be registered for all four passes of probe 66 assuming all grid lines 51 are non-defective. If the count is correct, computer 118 then actuates the appropriate sequence of solenoids 128, 122, 126 and 124 to release the vacuum from suction cups 85, raise the pistons 84, lower probes 56 and 58 and raise clamp cylinder and piston assemblies 64 as shown in the sequence of FIG. 7B. Further, the computer generates a signal to automatically feed the test data to a conventional printer, not shown, to providing appropriate documentation of the test result.

Preferably computer 118 and the associated circuitry provides an optional manual or automatic mode with respect to removal of a window which has failed the test.

In the described embodiment, a transfer switch 168 is provided which in the off position requires the operator to manually remove both a defective or non-defective window from table 42. In either the automatic or manual mode, the described system requires a non-defective window to be manually removed from table 42 and accordingly transferred for further handling. However, if the automatic mode is actuated via manually actuated switch 168, an indicator light 170 is lit to indicate the automatic sequence is operational and the computer dictates the sequence of steps shown in FIG. 7C to automatically transfer a defective window 50 from table 42 to a separate collection point apart from those windows which have passed the test.

As shown in FIG. 7C, when counter 148 shows an incorrect count, that is, less than a count equal to four times the number of all grid lines 51 are non-defective, a signal is generated which actuates solenoids 126, 124, 122 and 158 to raise the defective window from table 42 and transfer it rearwardly via transfer cylinder 79. Then solenoids 122, 128 and 158 are directed to actuate pistons 84 to lower the window and release the vacuum to cups 85. Next a signal is generated to raise pistons 84 and cause transfer cylinder 79 to return to its original forward position.

This automatic transfer system is represented by step B in the computer program logic which is illustrated in FIGS. 7B and 7C.

Figure 8:
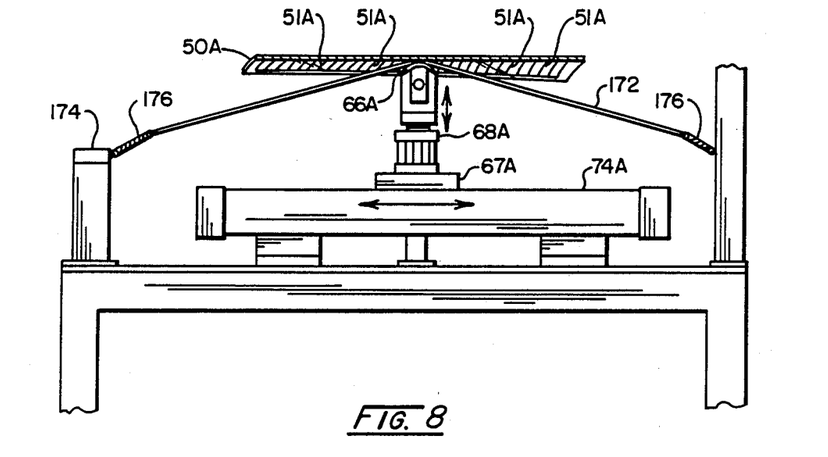
FIG. 8 is a partial side elevational view of another embodiment of the apparatus shown in FIG. 1 illustrating a modified control probe which only moves back and forth across the glass at one predetermined intermediate position and employs a modified contactor construction.
Figure 9:
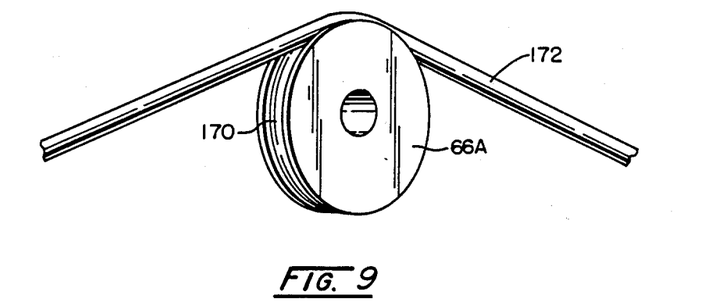
FIG. 9 is a partial perspective view of the rolling wheel and flexible wire contactor forming a portion of the central probe shown in FIG. 8.

Now specifically referring to FIGS. 8 and 9, a modified embodiment of a central moving probe 66-A is shown. For purposes of brevity and to avoid repetition, certain portions of the remaining structure shown in the embodiment of FIG. 1 which are unchanged are not shown or described in FIG. 8.

Modified probe 66-A is mounted to a vertically movable air cylinder 68-A which in turn is mounted to base 67-A. Base 67-A is mounted for travel along a band cylinder 74-A for movement perpendicular to the grid lines 51-A of window 50-A in only one pre-selected position intermediate outer probes such as 56 and 58 shown in the embodiment of FIG. 1, but not shown in FIG. 8. Therefore the need for a rotary actuator, such as 70, and the other band cylinder 80 is eliminated in the embodiment shown in FIGS. 8 and 9 along with any switches and other controls associated with those compoonents. It should be noted that windows which are not provided with a cut-out such as 53 in the grid system do not require the multiple passes at spaced lateral positions as described in the embodiment of FIG. 1. Probe 66-A merely travels in a single straight line back and forth across the grid lines.

Probe wheel 66-A includes a recess 170 which is adapted to receive a braided metal wire 172, preferably stainless steel, which is resiliently connected in a conventional manner between a pair of spaced insulator posts, such as 174 by a pair of respective springs 176. The points of connection between springs 176 and posts 174 and the ends of wire 172 are disposed below the upper end of wheel 66-A so the wire 172 forms a descending angle away from window 50-A. Therefore as wheel 66-A moves upon actuation of band cylinder 74-A, it rolls along wire 172 causing wire 172 to be lifted into engagement with the grid lines 51-A, at different points of contact along the length of wire 172.

One advantage of this construction is to provide another manner of electrical conducting engagement with each grid line 51-A which reduces the frictional forces which, if excessive, may damage the conductive paint forming each grid line 51-A during testing.

It should be noted however that such damage is not typical using the embodiment shown in FIG. 1 if the desired position of the window and the center probe is accurately maintained as described herein using appropriate reasonable manufacturing and design tolerances. Further, the shaft upon which wheel probes 66 or 66-A are mounted may be spring biased in a conventional manner to provide resiliency in a vertical direction to limit the force of engagement with window 50 or 50-A while assuring adequate contact is made. Limiting the force of engagement with the window by probe 66 or 66-A to approximately 15 pounds per square inch within a sufficient range of vertical motion has been found to work well in this regard. Other conventional means may be employed to provide a degree of resilient and force limited contact between probes 66 or 66-A and the grid lines.

Additionally, it has been found that wheel probe 66, as described in the embodiment of FIG. 1, may be provided with a recess similar to recess 170 in which a braided stainless steel wire in the form of a ring is fixedly mounted. The use of a stainless steel braided wire fixed to outer the periphery of the wheel probe at the point of engagement with window 50 appears to resist wear very well and yet provides a relatively softer surface than a solid steel wheel and therefore tends to reduce the likelihood of damage to the grid lines during rolling engagement across the grid lines. The object in this regard is to provide a conductive contact which minimizes the potential to damage the grid line which maintaining adequate resistance to wear of the contacting surface of the probe.

The embodiment shown in FIG. 8 represents an alternative construction particularly useful to further reduce any likelihood of damaging the grid lines during a test. However, other various constructions suitable for making electrical contact may be used to accomplish the desired results without departing from the spirit of the the present invention.

As seen in FIG. 8, as probe wheel 66-A rolls along and raises wire 172 into engagement with the surface of the window and into contact with a respective grid line 51-A, the surface of window 50-A is merely subjected to a vertical movement of wire 172 with no substantial frictional force being introduced by the motion of wheel 66-A.

With respect to the operation of the present invention using the modified probe wheel 66-A, the steps employed would be essentially identical, as described in connection with the embodiment of FIG. 1, except for the necessity of providing for lateral right or left movement. Since band cylinder 80 and rotary actuator 70 would be eliminated along with the respective contact switches associated with lateral movement, the electrical functions and any associated air cylinders and controls would be unnecessary. The actuation of vertical cylinder 68-A could readily be incorporated conventionally as a step similar to the acuation of clamp assemblies 64.

If it is desired to incorporate the wheel probe 66-A into the embodiment of FIG. 1 requiring multiple spaced passes, one could use two such devices spaced apart from one another with relatively minor conventional modification of the electrical control circuit.

Mounting probe 66-A for vertical movement via cylinder 68-A is an optional alterative form depending upon the user's optional choice but is not necessary in most applications. It is useful in certain applications wherein other means may be employed to fix the window into the desired test position or to aid in fixing the curvature of the windows being tested between upper and lower clamping means or stabilizing means, not shown, which may merely comprise additional nonconducting stops which are mounted for vertical movement coordinated with pick-up cylinders similar to those described herein.

Within the spirit of the present invention, it should be noted that the novel principles involved could easily be incorporated into a less expensive, more portable unit. Certain automated features and the base frame and support table could be eliminated and the center probe constructed for manually manipulation across the grid lines. A relatively small computer package and associated accessories permitting connection of the unit to a standard electrical wall socket could be conventionally adapted for use to control the electrical switching functions and count the signals generated indicating non-defective grid lines in the same manner as described herein in the preferred embodiment of FIG. 1.

In such a manually operated device, the control function would be simplified by the elimination of the air cylinders to drive the moving probe and those used to move the clamping assemblies 64 into engagement with the grid. However, it is believed that while useful in relatively low volume operations, the automated preferred embodiment described in detail herein would be more desirable than a manual portable unit in typical high volume production applications.

In view of the foregoing description, it should be understood to those skilled in the art that the present invention provides an efficient testing apparatus and method conducive to automotive manufacturing needs to control the quality of defrosting grid systems in a fast, accurate and consistent manner. The apparatus of the present invention reduces the likelihood of manual error in the testing procedure and may be incorporated with total resistance testing to assure defective grid systems are reliably detected prior to installation in the automobile.

While certain preferred embodiments of the present invention have been disclosed in detail, it is to be understood that various modifications may be adopted without departing from the spirit of the invention or scope of the following claims.

I claim:

1. An apparatus for continuity testing of windows provided with a resistance defrosting grid pattern of the type having a plurality of spaced, parallel extending grid lines connected at each opposing ends thereof to an electrically conducting bus line, comprising, in combination:
   (a) means to support a window under test;
   (b) a first and second electrically conducting probe, each of said probes conformed to engage a different one of said bus lines in electrically conducting relationship;
   (c) a third probe movable for travel transverse to the length dimension of said grid lines in electrically conducting relationship to each of said grid lines at a preselected position intermediate the ends of said grid lines;
   (d) an electrical power source operatively communicated to said probes and said grid lines;
   (e) control means operatively connected to said power source and including switch means to selectively alternate the polarity of said first and second probe relative to said third probe to establish an opposing polarity between said third probe and a selected one of said first and second probes;
   (f) sensing means operatively connected to said third probe for generating an electrical signal responsive to a predetermined voltage value selected to indicate a continuous non-defective grid line; and
   (g) means to count the signals generated by said sensing means and to indicate the number of non-defective grid lines contacted by said third probe operatively connected to said power source and said sensing means.

2. The apparatus defined in claim 1 wherein said third probe is configured for rolling engagement with the surface of said window.

3. An automated apparatus for continuity testing of windows provided with a resistance defrosting grid pattern having a plurality of electrically conducting, vertically spaced, parallel grid lines connected at each opposing end to an electrically conducting bus line, comprising in combination:
   (a) a base frame and supporting table;
   (b) means to support a window under test in a generally parallel spaced relationship on said table;
   (c) a first and second electrically conducting probe mounted on said base frame, each of said probes aligned to engage in electrically conducting relationship a different one of said bus lines at the opposing ends of said grid lines;
   (d) a third probe movably mounted on said base frame to travel at generally a right angle in electrically conducting relationship to each of said grid lines at a preselected position intermediate of said first and second probes to define a transverse pass of said third probe;

(e) an electric power source operatively connected to said probes and said grid lines;

(f) drive means mounted on said table and connected to said third probe to move said third probe across said grid lines;

(g) control means operatively connected to said power source and said drive means including switch means to selectively alternate the polarity connection between said first and second probes relative to said third probe and to actuate said drive means to move said third probe in a preselected coordinated pattern related to the selected polarity of said probes;

(h) sensing means operatively connected to said third probe for generating a signal responsive to a predetermined voltage range selected to indicate a non-defective grid line; and (i) means to count the signals generated by said sensing means to indicate the number of non-defective grid lines in said grid system operatively connected to said sensing means.

4. The testing apparatus defined in claim 3 wherein said third probe is configured for rolling engagement with the surface of said window under test.

5. The testing apparatus defined in claim 4 wherein said third probe is configured in the form of a rotatably mounted wheel.

6. The testing apparatus defined in claim 3 wherein said third probe is mounted for both lateral and transverse movement with respect to said grid lines; and means to actuate said lateral and transverse movement at preselected intervals dependent upon predetermined positions of said probe relative to said window grid.

7. The testing apparatus defined in claim 6 wherein said third probe is configured in the form of a wheel rotatable about an axis generally parallel to the surface of said window and said drive means includes means for pivoting the axis of said wheel in a direction generally parallel to the plane of said window.

8. The testing apparatus defined in claim 3 including a voltage source significantly greater than the standard automotive twelve volt source; and switch means to selectively connect said first and second probes to said greater voltage source for a predetermined length of time sufficient to enhance the detectability of any continuity defects in said grid lines prior to initiating the movement of said third probe.

9. The testing apparatus defined in claim 3 wherein said third probe includes a conducting wire extending transversely to said grid lines and mounted for resilient vertical movement into conducting engagement with a respective one of said grid lines during a transverse pass of said third probe.

10. An improved testing apparatus for testing continuity of a defrosting window grid system of the type having a plurality of parallel disposed resistance grid lines extending between and connected to laterally spaced conducting bus lines provided on a window comprising, in combination; a base means including a support table; means for supporting a window above said table; first and second electrical conducting probes laterally spaced from one another and mounted on said base means, each of said probes disposed to contact a different one of said bus lines of a defrosting grid provided on the window supported above said support table; a third electrical conducting probe movably mounted on said base means for conducting engagement with said window grid in a transverse direction across the length of said grid lines; control means operatively connecting electrical power to said window grid and to said probes and including switch means to alternate the polarity of said first and second probes in a predetermined manner with respect to said third probe to obtain a voltage signal between said third probe and a selected one of said first or second probes as said third probe travels transversely at a preselected position across said grid lines intermediate of said bus lines; and sensing means operatively connected to said third probe and responsive to a predetermined voltage range associated with a predetermined standard value to provide a signal only when a voltage within said predetermined range is generated upon contact between said third probe and each of said grid lines.

* * * * *